_United States Patent_ [19]

Malinowski et al.

[11] 4,361,837

[45] Nov. 30, 1982

[54] REMOTE CONTROL CIRCUIT EMPLOYING FREQUENCY/DIRECT SIGNAL CONVERTERS

[75] Inventors: Christopher W. Malinowski; Heinz Rinderle, both of Heilbronn, Fed. Rep. of Germany

[73] Assignee: Licentia Patent-Verwaltungs-G.m.b.H., Frankfurt am Main, Fed. Rep. of Germany

[21] Appl. No.: 85,334

[22] Filed: Oct. 16, 1979

[30] Foreign Application Priority Data

Oct. 16, 1978 [DE]  Fed. Rep. of Germany ....... 2844936
Oct. 16, 1978 [DE]  Fed. Rep. of Germany ....... 2845005

[51] Int. Cl.³ .............................................. G08C 19/00
[52] U.S. Cl. .......................... 340/825.72; 340/825.69;
340/825.7; 331/1 R; 331/11; 331/18; 332/19;
455/113; 455/119
[58] Field of Search ................... 340/694–696,
340/825.69, 825.7–825.72, 870, 26, 27; 455/119,
126, 113, 256, 260; 331/1 R, 2, 9, 11, 12, 18, 25,
44; 332/19

[56] References Cited

U.S. PATENT DOCUMENTS

| | | | |
|---|---|---|---|
| 3,087,121 | 4/1963 | Bell | 331/11 |
| 3,393,380 | 7/1968 | Webb | 455/119 |
| 3,587,003 | 6/1971 | Chastagnier | 455/113 |
| 3,944,925 | 3/1976 | De Laune | 455/119 |
| 4,131,861 | 12/1978 | Malaviya | 455/119 |
| 4,207,539 | 6/1980 | Minakuchi | 331/25 |

OTHER PUBLICATIONS

"Analog Multiplier/Divider Simplifies Frequency Locking", Electronics, Jul. 5, 1973, pp. 99, 100.

_Primary Examiner_—John W. Caldwell, Sr.
_Assistant Examiner_—Donnie L. Crosland
_Attorney, Agent, or Firm_—Spencer & Kaye

[57]     ABSTRACT

A remote control circuit which operates on a frequency basis and essentially with analog signals. The remote control circuit includes at the transmitting end a controlled oscillator, a frequency/direct signal converter and a comparator connected together into a frequency control loop. A transmitter is also provided which is fed by the oscillator of the control loop. A control path including a frequency signal source and a frequency/direct signal converter is provided at the transmitting end and receives its input signal from the frequency signal source. The converter of the control path is connected with the one input of the comparator of the control circuit. At the receiving end there is provided an amplifier, a frequency/direct signal converter and an evaluation circuit.

31 Claims, 21 Drawing Figures

REMOTE CONTROL CIRCUIT EMPLOYING FREQUENCY/DIRECT SIGNAL CONVERTERS

BACKGROUND OF THE INVENTION

It is known that at present radio and television receivers are operated by remote control. For example, remote control may be used to select a program, to adjust the volume as well as to set the brightness and the color contrast in color television receivers. However, remote controls are also used in many other fields of industry, as, for example, in the steering of vehicles and model aircraft.

Various methods exist for transmitting the control information. One transmission possibility exists in transmitting signals at different frequencies and then performing different functions by the selection of different frequencies. A remote control circuit requires a device which transmits the information and a device which receives the information.

SUMMARY OF THE INVENTION

It is the object of the invention to provide a remote control circuit which operates on a frequency basis and essentially with analog signals. This is accomplished according to the invention by the remote control circuit includes at its transmitting end, a controlled oscillator, a frequency/direct signal converter and a comparator connected together into a frequency control loop. A transmitter is also provided which is fed by the oscillator of the control loop. A control path including a frequency signal source and a frequency/direct signal converter is provided at the transmitting end and receives its input signal from the frequency signal source. The converter of the control path is connected with the one input of the comparator of the control circuit. At the receiving end there is provided an amplifier, a frequency/direct signal converter and an evaluation circuit.

It is known that in a frequency control loop the frequency signal generated by the oscillator is fed to the converter which generates from this frequency signal a direct signal which may be a direct voltage or a direct current. A direct voltage generated, for example, at the converter output is fed to the one input of the comparator. The second input of the comparator receives an external control voltage for controlling the loop, thereby determining the frequency of the loop. Such a frequency control loop has the advantage, compared to a controlled oscillator without loop, i.e. without additional converter and comparator, that a frequency is generated which does not change upon a change in the characteristic of the oscillator and thus remains stable when there are changes in the characteristic of the oscillator.

When a control voltage different from the direct voltage generated by the converter is applied to the second input of the comparator, a direct voltage is generated at the output of the comparator which voltage corresponds to the difference of the two input voltages at the comparator. The frequency control loop now has a tendency to reduce the difference voltage present across the comparator input. This is done in that the output voltage of the comparator controls the frequency of the oscillator in such a manner that such a direct voltage change occurs at the output of the converter that the converter output voltage adapts itself to the external control voltage fed to the comparator. This adaptation process takes place until the difference between the two voltages approaches zero. The then resulting frequency is then determined only by the characteristic of the converter while changes in frequency determining resonant circuit elements in the oscillator are of no significance since the control loop automatically corrects such changes.

However, the known frequency control loops which include an oscillator, a converter and a comparator, have drawbacks which originate essentially from the converter properties. Frequency/direct signal converters are known to change their characteristic (ratio of direct signal to frequency) in dependence on the external operating conditions such as temperature and operating voltage. Moreover, there exist problems in such converters regarding the linearity between the change in frequency and the output signal.

In the remote control circuit according to the invention there is therefore provided a frequency signal source and a second converter as the control path which furnishes the control signal for the control loop or from whose output signal is derived the control signal for the control loop (by amplification or attenuation). If a direct signal is mentioned here, this is understood to mean a direct voltage or a direct current.

The frequency control loop according to the invention is to generate not only a single frequency but it should also be able to furnish signals at different frequencies. Since a certain control signal in a single frequency control loop can generate only one frequency, it is necessary to have variable control signals for the control loop if the frequency to be generated is to be changed. In the case of the invention, the control signal source for the control loop is the control path including the frequency signal source and the second frequency/direct signal converter or the second frequency/direct signal converter controlled by the frequency signal source, respectively. The control signal furnished by this control path can, however, still be attenuated or amplified.

Different control signals for the control loop can be generated in different ways with the aid of the control path including the frequency signal source and the second converter. One way is, for example, the use of a variable frequency signal source and to vary only the frequency of these signals. Or there exists the possibility of amplifying or attenuating the signal furnished by the variable frequency signal source which has been converted into a direct signal by the second converter. There exists the further possibility of using a frequency signal source with constant frequency (e.g. a quartz oscillator) and to vary correspondingly by attenuation or amplification the direct signal produced by the second converter from the frequency signal of such a signal source. For a direct voltage, for example, signal attenuation is realized by means of a passive voltage divider or by active voltage division in an amplifier arrangement, while signal amplification is effected in an amplifier.

DESCRIPTION OF THE PREFERRED EMBODIMENTS

Figure 1:
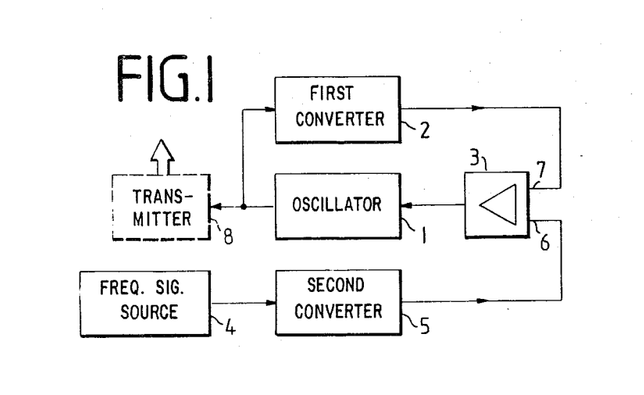
FIGS. 1–4 are block circuit diagrams of preferred embodiments of remote control transmitters according to the invention.

FIG. 1 shows an embodiment for the transmitting end of the remote control circuit with a frequency control loop including the oscillator 1, the frequency/direct signal converter 2 and the comparator 3. In order to compensate for the adverse effects of the external operating conditions such as temperature and operating voltage on the converter characteristic, there is provided, according to FIG. 1, in addition to the control loop, a frequency signal source 4 and a second frequency/direct signal converter 5. The frequency signal source 4 and the converter 5 serve to generate the control signal for the control loop. The frequency signal source 4 furnishes a frequency signal which is fed to the input of converter 5. From this frequency signal, the converter 5 generates at its output a direct signal which is the control signal for the control loop and is fed to the one input (6) of the comparator 3. The second input (7) of the comparator 3 receives the output signal of the first converter 2. Both input signals of the comparator are compared with one another in the comparator and the difference signal resulting from the comparison is amplified in comparator 3 and fed to the oscillator 1 as control signal (setting value). At its output, the oscillator 1 generates a frequency signal which serves to feed the transmitter 8 and is additionally fed to the input of the first converter 2.

The operation of the combination of a frequency control loop with the given control path can best be explained under consideration of the steady state of a control loop according to FIG. 1 including an oscillator 1, the converter 2 and the comparator 3 in which loop a frequency signal at constant frequency appears with unchanging control signal. If in this (steady) state the external operating conditions change, as for example the operating temperature or the operating voltage, the characteristic of the converter 2 of the control loop will change in an undesirable manner. This change in characteristic results in an undesirable change in frequency of the frequency signal of the control loop. However, this undesirable change in frequency is compensated, according to the invention, by the second converter 5 since under the condition that the second converter have the same characteristic as the first converter, the control signal generated by the second converter 5 changes in the same sense and in the same ratio as the output signal of the first converter 2 as a result of changes in the operating conditions. If such signals, which were changed in the same sense and in the same ratio, are compared with one another in the comparator 3, the signal changes resulting from a change in operating conditions will cancel one another out. Since in the steady state the difference between the input signals of the comparator 3 approaches zero, this state will remain in effect even if the two signals change in the same sense and in the same ratio. Consequently, the frequency generated by the oscillator remains constant in spite of the change in operating conditions.

Frequency control loops serve to stabilize the frequency of the frequency signal generated by the oscillator of the control loop. Circuit arrangements having an additional (second) converter and an additional frequency signal source according to the invention even increase the frequency stability and this for the reason that, as described above, changes in the characteristic of the converter of the control loop are compensated by the second converter. However, as already described, such a compensation requires that the second converter have as much as possible the same properties as the first converter of the control loop. This can be accomplished by a structure which is as identical as possible, i.e. the first and second converters should comprise the same components if possible.

An essentially identical structure of converters can be realized, for example, by way of monolithic integration, since components which are produced together in one and the same semiconductor body by means known in the semiconductor art (implantation, diffusion, epitaxy) have particularly closely coinciding properties if they are produced simultaneously and with the same processing methods. This applies mainly for components which are disposed on the semiconductor wafer in the immediate vicinity of each other. The two converters may have a common semiconductor body or separate semiconductor bodies in that, for example, the common semiconductor disc is subdivided. Or the converters may be produced, for example, in thick film and/or thin film technique, since this technique also permits the realization of coinciding properties for the converters. In the case where the converters are separated from one another, they should have a common substrate since a common substrate is the best assurance for identical temperature conditions.

Figure 2:
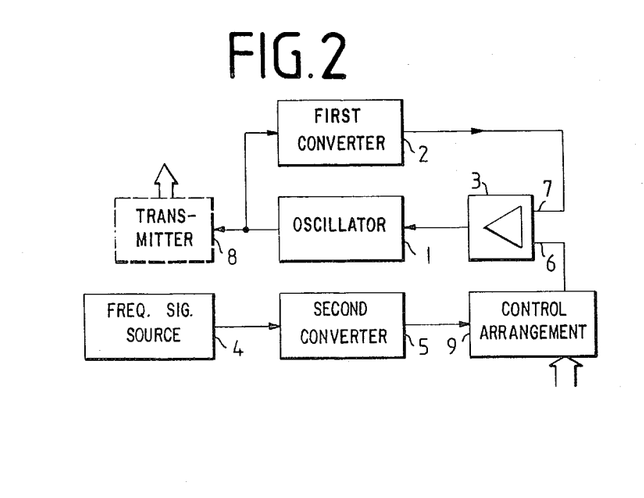

The transmitting end of the remote control circuit shown in FIG. 2 differs from the arrangement of FIG. 1 in that between the second converter 5 and the comparator 3 there is connected a control arrangement 9. The control arrangement 9 serves to attenuate or amplify the output signal of the second converter 5. While in the arrangement of FIG. 1 a change in the control signal is possible only by way of a change in the frequency of the signal from the frequency signal source 4, the control arrangement of FIG. 2 offers an additional (second) way of controlling since the control arrangement 9 can be used to influence the direct signal furnished by the second converter 5. In the arrangement of FIG. 2, a change in the control signal is thus possible by changing the frequency of the frequency signal from the signal source 4, by changing by means of the control arrangement 9 the direct signal emitted by the second converter 5 or by a combination of these possible variations. Suitable control arrangements will be described later.

In the circuit of FIG. 2, the control arrangement 9 serves for frequency modulation. If in the circuit arrangement of FIG. 2 the output signal from converter 5 is superposed with an alternating signal in control arrangement 9, the control loop produces a modulated frequency signal with a carrier frequency which corresponds to the direct signal at the comparator input 6 and at a modulation frequency which corresponds to the alternating signal superposed on the direct signal. The modulation rise of the modulated frequency signal corresponds to the amplitude of the alternating signal superposed on the direct signal. With such a transmitter signal, the modulation signal can be recovered at the receiving end by means of demodulation, thus furnishing additional information to the information furnished by the carrier frequency.

Figure 3:
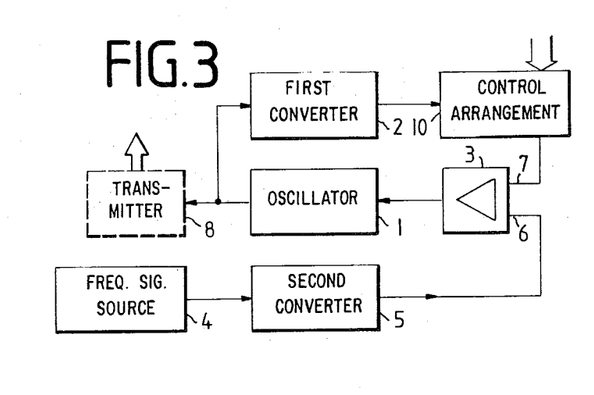

In the transmitting end arrangement of FIG. 3, the control arrangement is not connected between the second converter 5 and the comparator 3 but between the comparator 3 and the first converter 2. In the arrangement of FIG. 3, the control arrangement 10 therefore does not vary the direct signal of the second converter 5 but the direct signal of the first converter 2.

Figure 4:
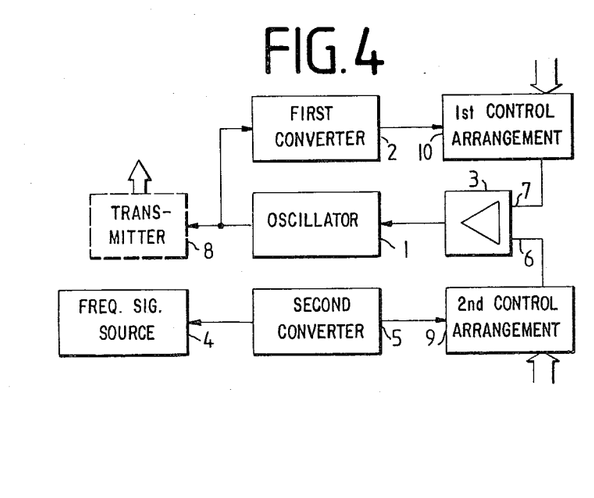

In the transmitting end arrangement of FIG. 4, there are three possible variations, i.e. the possibility of varying the frequency of the signal from the frequency signal source 4, the possibility of varying the direct signal from the second converter 5 by means of the control arrangement 9 and the possibility of varying the direct signal from the first converter 2 by means of the control arrangement 10.

The converters employed for the remote control are generally frequency/voltage converters or frequency/current converters. The frequency/voltage converters employed may be, for example, the known converter types VFC 32 (BURR BROWN), XR 4151 (EXAR), $\mu$A 4151 (FAIRCHILD), 9400 (TELEDYNE), A 84808 (INTECH) and XC 3315 (MOTOROLA). By connecting thereto a voltage/current converter, the known frequency/voltage converters can be made into frequency/current converters.

Figure 5:
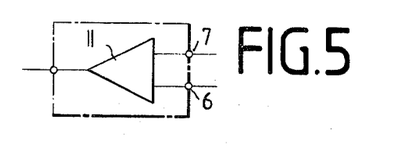
FIGS. 5–14 are circuit diagrams of suitable embodiments of components which can be employed in the circuits of FIGS. 1–4.
Figure 6:
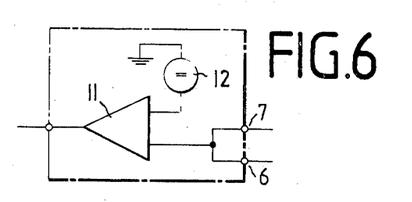

FIG. 5 shows a voltage comparator for use in the control circuits and FIG. 6 shows a current comparator. A voltage comparator is required if the control loop furnishes a direct voltage to the comparator. A current comparator is required if the control loop furnishes a direct current to the comparator. The voltage comparator of FIG. 5 includes a known operational amplifier 11 whose output signal depends on the potential difference between the inputs 6 and 7. The current comparator of FIG. 6 likewise includes an operational amplifier 11. In the current comparator of FIG. 6, the direct current coming from the control loop as well as the control signal coming from the control path (frequency signal source plus converter) or the control signal coming from the control arrangement, respectively, are fed to the same input of the operational amplifier 11. At the other input of the comparator there is connected a reference signal source 12 which furnishes any desired reference potential. The output voltage of the operational amplifier 11 depends, in the current comparator of FIG. 6, on the sum of the currents fed to the inputs 6 and 7 of the comparator.

Figure 7:
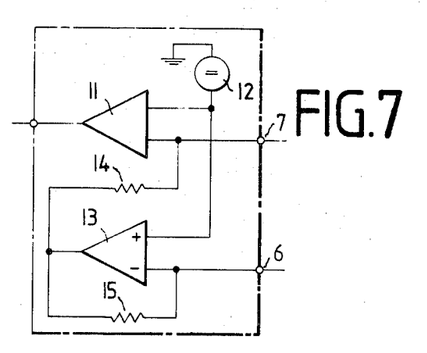

While in the arrangement of FIG. 6, the inputs 6 and 7 must receive oppositely directed currents, this is not necessary in the current comparator of FIG. 7 since in the arrangement of FIG. 7 the current fed to the input 6 is inverted by means of the inverter circuit including the inverter 13 and resistors 14 and 15.

Figure 8:
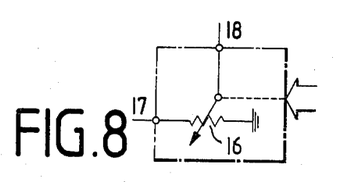
Figure 9:
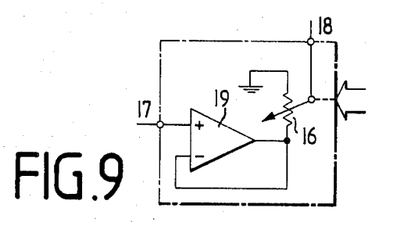
Figure 10:
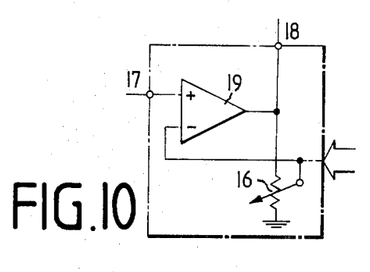

FIGS. 8 to 10 show basic shapes of control arrangements for voltage controlled control loops. As already expressed, there exist voltage reducing and voltage amplifying controls for regulating a voltage. FIGS. 8 and 9 show voltage reducing control arrangements. The control arrangement of FIG. 8 is a voltage divider 16. The input 17 is generally connected with the converter and the tap (18) is connected with the comparator.

While the arrangement of FIG. 8 is a passive control arrangement, the arrangement of FIG. 9 is an active control arrangement because in the arrangement of FIG. 9 there is provided, in addition to the voltage divider 16, an operational amplifier 19. This operational amplifier serves to decouple the voltage divider and the converter.

FIG. 10 shows an amplifying control arrangement including the voltage divider 16 and the operational amplifier 19.

Figure 11:
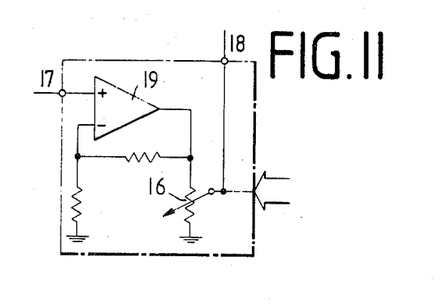

FIG. 11 shows a control arrangement including an operational amplifier 19. The output signal of the converter is fed to the input 17 of the operational amplifier 19 and is amplified by the operational amplifier. The voltage divider 16 divides the output voltage of the operational amplifier 19. With the corresponding setting of the voltage divider 16, a voltage is obtained at its output 24 [sic] in the control arrangement which voltage is greater, equal to or less than the voltage at the input 23 [sic] of the operational amplifier.

Figure 12:
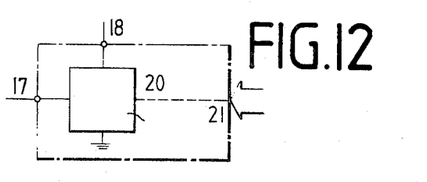

The control arrangement of FIG. 12 includes a digital/analog converter 20 which serves as a digitally controlled potentiometer. The digital/analog converter receives at its input 17, as usual, a direct converter signal while the digital/analog converter is digitally controlled at the control input 21. The output signal is produced at the output 18.

Figure 13:
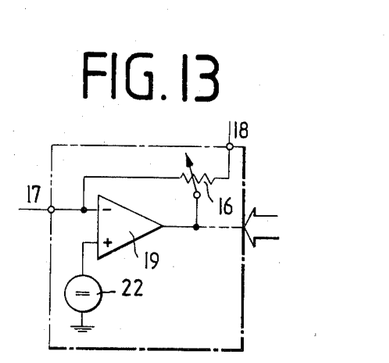
Figures 14, 15, 16:
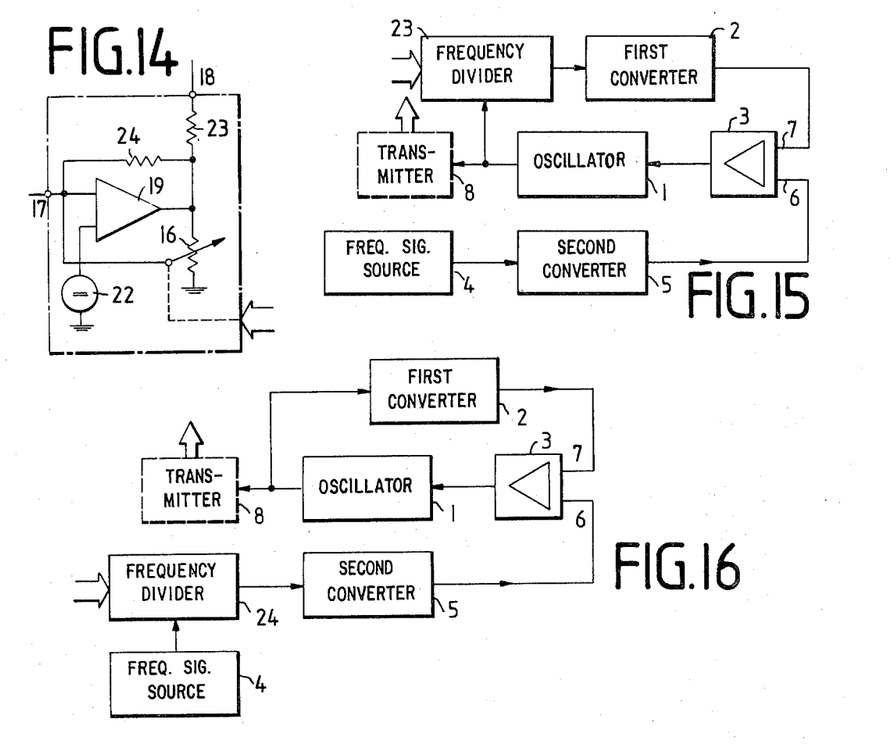
FIGS. 15-18 are block circuit diagrams of further preferred embodiments of remote control transmitters according to the invention.

FIGS. 13 and 14 show current controlled control arrangements. In these control arrangements, no voltage but a direct current is fed by the converter to the input 17 of the control arrangement. The arrangement of FIG. 13 includes an operational amplifier 19 which serves as current/voltage converter. The operational amplifier 19 amplifies the potential difference generated at its input. Between the one input of the operational amplifier 19 and the output 18 of the control arrangement there is connected a resistance divider 16 whose tap is connected with the output of the operational amplifier 19. The voltage occurring at the output of the operational amplifier 19 generates, in the branch between output and input of the operational amplifier 19, a current which sets itself in such a way that it takes on the magnitude of the direct current fed to the input 17 and is directed oppositely to this direct current. This causes the potential difference at the input of the operational amplifier to approach zero. The voltage source 22 connected to the input of the operational amplifier 19 determines the potential at the input of the operational amplifier. This potential actually may be as desired. Preferably, however, this potential is equal to the potential furnished by the voltage source 12 of the comparators. The output current is determined by the resistance component lying between the output of the operational amplifier 19 and the output 18 of the control arrangement. This is the case only, however, if a comparator is connected to the output 18 of the control arrangement to correspond to the comparator of FIGS. 6 and 7.

In the control arrangement of FIG. 14, there is likewise provided an operational amplifier 19. Between its output and ground there is connected a resistance divider 16 whose tap is connected with the one input (17) of the operational amplifier 19. By setting that resistance which lies between the output of the operational amplifier and the tap of the resistance divider 16, the gain of the operational amplifier 19 is regulated. Between the input (17) of the operational amplifier 19 and ground there exists a potential difference which results in a current flowing through the resistance divider 16 to ground. This current influences the current at the output 18 of the control arrangement. The resistors 23 and 24 are codecisive for the output current and the gain of the operational amplifier.

Generally, frequency control loops should furnish signals at a constant frequency. For that purpose the frequency signal source furnishes a signal at a defined frequency. If a control arrangement is provided, the output signal of this control arrangement is selected so that the frequency control circuit (oscillator) furnishes the defined constant frequency.

However, there also exists the possibility of modulating the signals of the signal frequency source in such a way that a direct signal with superposed alternating signal appears at the output of the frequency/direct signal converter connected behind the signal frequency source. In this case, the frequency control circuit also furnishes modulated frequencies.

However, such a frequency modulation can also be realized with an alternating signal which is superposed over the direct signal(s) fed to the comparator. There of course also exists the possibility of combining the frequency modulation of the signal from the frequency signal source with the just described alternating signal superposition.

The drawing figures show broad arrows which have a symbolic meaning; i.e., these arrows are intended to express that the control arrangements are controlled externally. This control may be effected, for example, mechanically, electrically, optically or magnetically.

Figure 17:
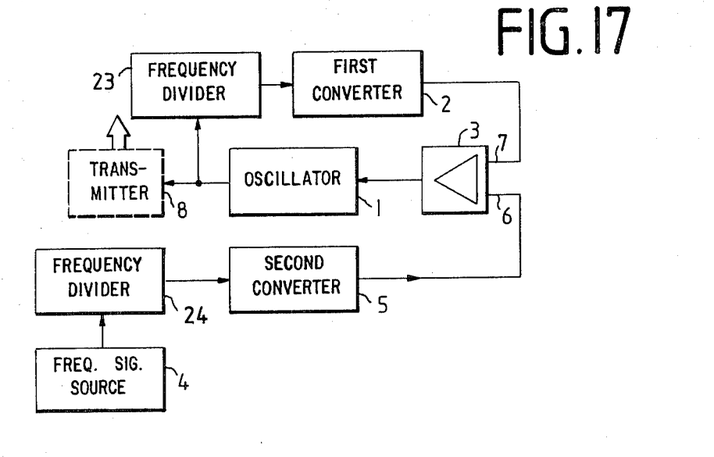

The circuit arrangements of FIGS. 15, 16 and 17 differ from the above-described circuit arrangements in that an additional way of controlling is provided, i.e., in the form of the frequency dividers 23 and 24. In the arrangement of FIG. 15, a frequency divider 23 is connected between the oscillator 1 and the converter 2 of the frequency control loop. This frequency divider 23 can also be used to control the oscillator frequency of the frequency control loop.

In the arrangement of FIG. 16, a frequency divider 24 is connected between the frequency signal source 4 and the converter 5 of the control path so that the additional frequency regulation is effected by the frequency divider in the control path.

The arrangement of FIG. 17 represents a combination of the possibilities shown in FIGS. 15 and 16; in the arrangement of FIG. 17, two frequency dividers (23, 24) are provided, one of which (23) is disposed in the frequency loop and the other (24) is disposed in the control path.

Figure 18:
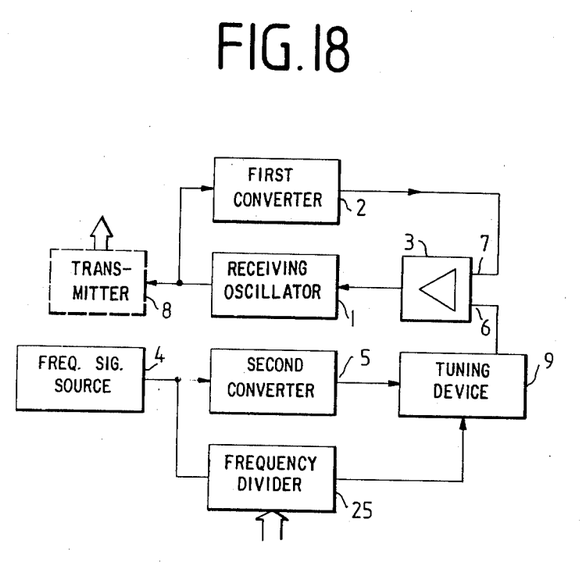

In the circuit arrangement of FIG. 18, a frequency divider 25 is provided which is connected between the frequency signal source 4 and the control arrangement 9. This frequency divider 25 divides the frequency signal of the frequency signal source and the divided signal is superposed in the control arrangement on the direct signal from converter 5. The modulation frequency can be set by controlling the dividing ratio of the frequency divider.

In the transmitter arrangement of the remote control circuit, the oscillator 1 of the frequency control loop generates a signal at the desired frequency which is transmitted by transmitter 8. The transmitter either transmits the frequency of the oscillator directly or the transmitter signal is modulated with the frequency of the oscillator. Direct transmission of the oscillator frequency is effected, for example, in infrared transmitters which amplify the frequency signal of the oscillator and then charge an infrared diode with that signal so as to emit infrared radiation whose intensity is varied in the rhythm of the oscillator frequency. Such infrared transmitters are known.

Figure 19:
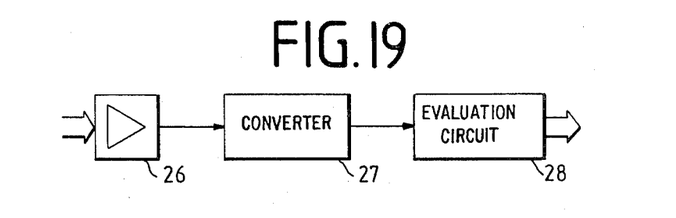
FIGS. 19-21 are block circuit diagrams of embodiments of remote control receivers according to the invention.

FIG. 19 shows the receiving end of a remote control circuit according to the invention. According to FIG. 19, the receiving arrangement of the remote control circuit includes an amplifier 26, a frequency/direct signal converter 27 and an evaluation circuit 28. The amplifier 26 amplifies the received signal. The output signal of the amplifier 26 reaches the converter 27 which generates a direct signal from the amplified frequency signal. The direct signal generated by converter 27 is fed to the evaluation circuit 28. The evaluation circuit 28 is, for example, an analog/digital converter which furnishes a digital signal at its output corresponding to the direct signal fed to its input. If a certain digital signal appears at the output of the evaluation circuit, a certain function will be performed. Then with the appropriate association of functions to certain digital signals, a certain digital signal can be used to perform a certain function, such as, for example, the regulation of volume, tone, etc.

Figure 20:
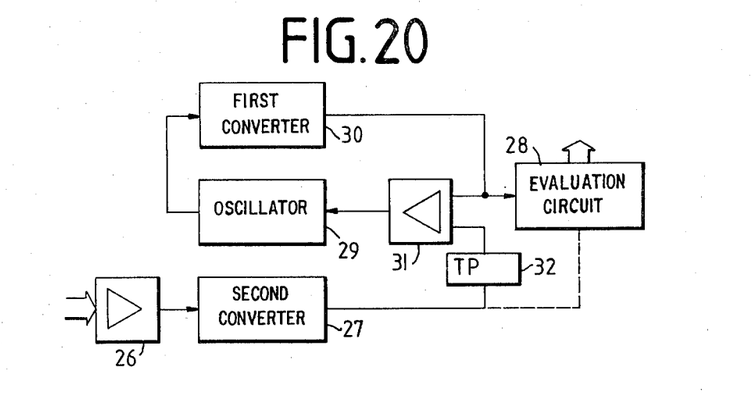

FIG. 20 shows another receiver circuit for the remote control circuit. In the arrangement of FIG. 20, the received signal is again fed to an amplifier 26 and the amplified signal is converted into a direct signal by converter 27. The direct signal, however, is not fed directly to the evaluation circuit 28 but to a control loop including the oscillator 29, the frequency/direct signal converter 30 and the comparator 31. The control loop is controlled with the direct signal of the converter.

The frequency control loop serves the purpose of reducing the sensitivity to interference of the system by utilization of the "flywheel effect" of the oscillator of the control loop. If, for example, there would occur a temporary, undesirable change in, or even a complete absence of, the received signal, the direct signal at the comparator would not be changed directly or even disappear, respectively, thus realizing greater stability of the system. The lowpass filter 32 serves the purpose of taking care, in the case where a modulation signal is present, that this modulation signal is kept away from the comparator 31 and only the direct signal is permitted to pass. Instead, a modulation signal is fed directly to the evaluation circuit.

Figure 21:
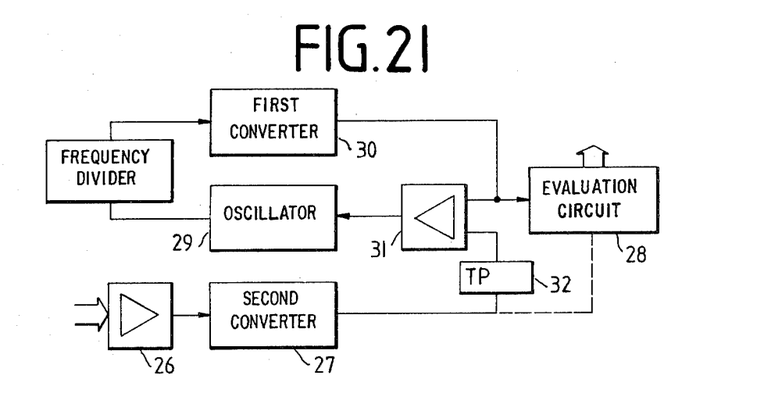

Oscillators for relatively low frequencies are relatively difficult to assemble with conventional components. In order to be able to use oscillators built for higher frequencies with relatively low frequencies, the receiving circuit of FIG. 21 provides a frequency divider 32 between the oscillator 29 and the converter 30 in the control loop. This frequency divider divides the higher frequency coming from the oscillator so that at the input of the converter 30 of the control loop the correct operating frequency range is available which at one input of the comparator 31 generates a direct signal corresponding to the control signal fed to the other input of the comparator 31.

We claim:

1. A remote control circuit including a transmitting portion comprising: a first controllable oscillator having a control input, a first frequency/direct signal converter and a first comparator which are connected together into a frequency control loop, with said first converter being connected to receive an input signal having a frequency proportional to that produced by said oscillator, one input of said first comparator being connected to receive a signal proportional to that produced by said first converter, and said oscillator control input being connected to receive a signal proportional to that at the output of said first comparator; a transmitter connected to receive the output signal from said oscillator of the control loop; and means defining a control path including a frequency signal source and a second frequency/direct signal converter which receives its input signal from the frequency signal source, with said second converter having its output connected with the other input of said first comparator of the control circuit, and a receiving portion comprising: a second controllable oscillator having a control input, a third frequency/direct signal converter and a second comparator connected together into a frequency control loop, with said third converter being connected to receive an input signal having a frequency proportional to that produced by said second oscillator, one input of said second comparator being connected to receive a signal proportional to that produced by said third converter, and said second oscillator control input being connected to receive a signal proportional to that at the output of said second comparator; and means defining a second control path for controlling said receiving portion control loop and including an amplifier and a fourth frequency/direct signal converter connected in series with said amplifier and having an output connected with the other input of said second comparator.

2. Remote control circuit according to claim 1 further comprising signal amplifying or attenuating means connected between one of said first and second converters and said first comparator.

3. Remote control circuit according to claim 1 or 2 wherein the signal supplied to said other input of said first comparator is selected in such a manner that said first oscillator furnishes a defined frequency to the control loop.

4. Remote control circuit according to claim 1 or 2 wherein said second converter is designed in such a manner that undesirable changes in frequency of said transmitting portion control loop, which are the result of undesirable changes in the characteristic of said first converter, are compensated.

5. Remote control circuit according to claim 4, characterized in that the configuration of said second converter is as identical as possible to the configuration of said first converter.

6. Remote control circuit according to claim 5 wherein both of said converters are monolithically integrated.

7. Remote control circuit according to claim 6, characterized in that both of said converters have a common semiconductor body.

8. Remote control circuit according to claim 6 wherein each said converter is formed on a separate semiconductor body.

9. Remote control circuit according to claim 5 wherein both of said converters of each said portion are designed, at least in part, in thick film and/or thin film technique.

10. Remote control circuit according to claim 5 wherein both of said converters of each said portion have a common substrate.

11. Remote control circuit according to claim 10 further comprising means in said transmitting portion control path for amplifying or attenuating the signal provided by said control path to said first comparator.

12. Remote control circuit according to claim 1 or 2 wherein said first comparator is a voltage comparator comprising an operational amplifier.

13. Remote control circuit according to claim 1 or 2 wherein said first comparator is a current comparator comprising an operational amplifier, with one input of said operational amplifier being connected to both inputs of said first converter and the other input of said operational amplifier being connected to receive a reference signal.

14. Remote control circuit according to claim 13 further comprising an inverter connected in series with one of the two input signals to said one input of said operational amplifier to cause the two input currents to said one input of said operational amplifier to be directed in opposite directions.

15. Remote control circuit according to claim 2 wherein said means connected between said one converter and said first comparator is a voltage divider.

16. Remote control circuit according to claim 15 further comprising an operational amplifier connected to decouple said voltage divider and said one converter.

17. Remote control circuit according to claim 2 wherein said first means connected between said one converter and said comparator includes an operational amplifier and a series connected voltage divider.

18. Remote control circuit according to claim 2 wherein said means connected between said first one converter and said comparator includes a digital/analog converter having one input connected to receive a converter/direct signal and a control input connected to receive a digital signal.

19. Remote control circuit according to claim 2 wherein said means connected between said one converter and said first comparator is a current controlled control arrangement which includes an operational amplifier, a resistance divider and a voltage source, said resistance divider being connected between one input of said operational amplifier and the output of said control arrangement, said resistance divider having a tap connected with the output of said operational amplifier, and said voltage source being connected to furnish a potential to the other input of said operational amplifier.

20. Remote control circuit according to claim 2 wherein said means connected between said one converter and said first comparator is a current controlled control arrangement which includes an operational amplifier, a resistance divider and a voltage source, said resistance divider being connected between the output of said operational amplifier and ground, said resistance divider having a tap connected with one input of said operational amplifier, said voltage source being connected with the other input of said operational amplifier, and the output of said operational amplifier being connected via a resistor with the output of said control arrangement.

21. Remote control circuit according to claim 2 wherein said means connected between said one converter and said first comparator is a control arrangement having at least two outputs, said control arrangement including an operational amplifier, a voltage source and two variable resistors, the output of said operational amplifier being connected via one of said two variable resistors with one output of said control arrangement and, via the other one of said two variable resistors, with another output of said control arrangement, one input of said operational amplifier being connected via a resistor with the output of said operational amplifier, and said voltage source being connected with the other input of said operational amplifier.

22. Remote control circuit according to claim 1 or 2 further comprising a frequency divider connected between said first oscillator and said first converter.

23. Remote control circuit according to claim 1 or 2 further comprising a frequency divider connected between said frequency signal source of the control path and said second converter.

24. Remote control circuit according to claim 1 or 2 further comprising means for imposing a frequency modulation on the output signal from said first oscillator.

25. Remote control circuit according to claim 2 wherein said amplifying or attenuating means are connected between said second converter and said first comparator, and further comprising a frequency divider connected between said frequency signal source and said amplifying or attentuating means.

26. Remote control circuit according to claim 1 further comprising a lowpass filter connected between said fourth converter and said second comparator.

27. Remote control circuit according to claim 1 or 26 further comprising an evaluation circuit connected between said second comparator and said fourth converter.

28. Remote control circuit according to claim 1 or 26 further comprising a frequency divider connected between said second oscillator and said fourth converter.

29. Remote control circuit as defined in claim 27 wherein said evaluation circuit is an analog/digital converter.

30. Remote control circuit according to claim 24 wherein said means for imposing a frequency modulation comprise means for modulating the signal provided by said frequency signal source.

31. Remote control circuit according to claim 24 wherein said means for imposing a frequency modulation comprise means for superimposing an alternating signal on the direct signal furnished by said second converter.

* * * * *